(12) United States Patent
Zhu

(10) Patent No.: US 9,641,138 B2
(45) Date of Patent: May 2, 2017

(54) MULTIPATH FEEDFORWARD BAND PASS AMPLIFIER

(71) Applicant: ANALOG DEVICES, INC., Norwood, MA (US)

(72) Inventor: Ning Zhu, Belmont, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/682,818

(22) Filed: Apr. 9, 2015

(65) Prior Publication Data

US 2016/0301370 A1 Oct. 13, 2016

(51) Int. Cl.
| | |
|---|---|
| *H03F 3/191* | (2006.01) |
| *H03F 3/193* | (2006.01) |
| *H03F 1/42* | (2006.01) |
| *H03F 1/02* | (2006.01) |
| *H03F 3/45* | (2006.01) |
| *H03F 1/08* | (2006.01) |
| *H03F 1/32* | (2006.01) |
| *H03F 3/189* | (2006.01) |

(52) U.S. Cl.
CPC .......... *H03F 3/193* (2013.01); *H03F 1/0205* (2013.01); *H03F 1/08* (2013.01); *H03F 1/086* (2013.01); *H03F 1/3223* (2013.01); *H03F 1/42* (2013.01); *H03F 3/189* (2013.01); *H03F 3/45179* (2013.01); *H03F 2200/429* (2013.01); *H03F 2200/451* (2013.01); *H03F 2203/45154* (2013.01)

(58) Field of Classification Search
CPC ....................................... H03F 3/191
USPC ................................... 330/306, 151
See application file for complete search history.

(56) References Cited

U.S. PATENT DOCUMENTS

| | | | | |
|---|---|---|---|---|
| 3,896,395 A | * | 7/1975 | Cox ...................... | H03F 1/3223 327/105 |
| 4,103,243 A | * | 7/1978 | Orban .................. | H03G 3/3005 327/309 |

(Continued)

FOREIGN PATENT DOCUMENTS

EP      1010237     6/2000

OTHER PUBLICATIONS

Mitteregger, Gehard et al., "A 20-mW 640-MHz CMOS Continuous Time ΔΣ ADC With 20-MHz Signal Bandwidth, 80-dB Dynamic Range and 12-bit ENOB", IEEE Journal of Solid-State Circuits, Dec. 2006, pp. 2641-2649, vol. 41, No. 12. [Abstract only], 2 pages.

(Continued)

*Primary Examiner* — Henry Choe
(74) *Attorney, Agent, or Firm* — Patent Capital Group

(57) ABSTRACT

An exemplary multipath feedforward amplifier includes a plurality of amplification stages configured to form at least partially distinct amplification paths extending from an input terminal to an output terminal, each amplification path defined by a respective subset of the plurality of amplification stages, wherein at least one amplification stage is a band pass resonator. In various implementations, multipath feedforward amplifier can maximize gain at a frequency of interest by having an amplification path that cascades band pass resonators. In various implementations, the plurality of amplification paths are configured to optimize gain at a center frequency ranging from about 2 GHz to about 3 GHz.

20 Claims, 5 Drawing Sheets

(56) References Cited

U.S. PATENT DOCUMENTS

| | | | | |
|---|---|---|---|---|
| 4,136,314 A | * | 1/1979 | Blackmer | H04B 1/64 327/350 |
| 4,229,619 A | * | 10/1980 | Takahashi | H04R 3/02 330/109 |
| 4,380,738 A | | 4/1983 | Wagner | |
| 5,117,197 A | | 5/1992 | Hsu et al. | |
| 5,608,351 A | | 3/1997 | Ward | |
| 6,002,299 A | | 12/1999 | Thomsen | |
| 6,184,748 B1 | * | 2/2001 | Rao | G11B 20/10009 327/552 |
| 6,424,215 B1 | | 7/2002 | Rice | |
| 7,076,224 B2 | * | 7/2006 | Giry-Cassan | H03G 3/3068 330/254 |
| 7,106,132 B1 | | 9/2006 | Kewariwal et al. | |
| 7,173,485 B2 | | 2/2007 | Nagai | |
| 7,301,395 B2 | | 11/2007 | Mobbs | |
| 7,323,955 B2 | * | 1/2008 | Jachowski | H01P 1/2039 327/556 |
| 7,336,128 B2 | | 2/2008 | Suzuki et al. | |
| 7,365,668 B2 | | 4/2008 | Mitteregger | |
| 7,599,678 B2 | * | 10/2009 | Fisher | G01S 11/10 342/156 |
| 8,102,206 B2 | * | 1/2012 | Shibata | H03F 3/211 330/124 R |
| 8,536,939 B2 | * | 9/2013 | Shibata | H03F 3/45183 330/124 R |
| 9,306,603 B2 | * | 4/2016 | Lee | H04B 1/0053 |
| 2005/0200408 A1 | | 9/2005 | Benjamin et al. | |
| 2006/0103560 A1 | | 5/2006 | Nagai | |
| 2009/0146736 A1 | * | 6/2009 | Kim | H03F 1/3247 330/149 |
| 2010/0283545 A1 | | 11/2010 | Shibata | |
| 2011/0304393 A1 | | 12/2011 | Luff | |

OTHER PUBLICATIONS

You, Fan et al., "Multistage Amplifier Topologies with Nested Gm-C Compensation", IEEE Journal of Solid-State Circuits, Dec. 1997, pp. 2000-2011, vol. 32, No. 12. [Abstract only], 2 pages.

Thomsen, A. et al., "A Five Stage Chopper Stabilized Instrumentation Amplifier using Feedforward Compensation", 1998 IEEE Symposium on VLSI Circuits, Digest of Technical Papers, pp. 220-223. Jun. 1998. [Abstract only], 2 pages.

Search Report issued in EP Patent Application Serial No. 1613754.1 mailed Sep. 12, 2016, 11 pages.

Yang, Xi, "Design of a Continuous-Time Bandpass Delta-Sigma Modulator," Submitted to the Dept. of Electrical Engineering and Computer Science, Feb. 2014 © MIT 2014, 106 pages.

* cited by examiner

US 9,641,138 B2

MULTIPATH FEEDFORWARD BAND PASS AMPLIFIER

TECHNICAL FIELD

The present disclosure relates generally to amplifiers, and more particularly, multipath feedforward amplifiers.

BACKGROUND

Amplifiers can increase a signal property (for example, current, voltage, power, other signal property, or a combination thereof) of an incoming signal, such as an electrical signal. Many applications implement amplifiers to achieve desired functionality. For example, analog-to-digital converters (ADCs) typically implement amplifiers in various ways when converting an analog signal to a digital signal. Modern process technologies are giving rise to ADCs that can process ever higher frequencies, often enabled by amplifiers that can provide sufficiently high gains at these higher frequencies. Although existing amplifiers have been generally adequate for their intended purposes, they have not been entirely satisfactory in all respects, particularly for high frequency signal processing.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
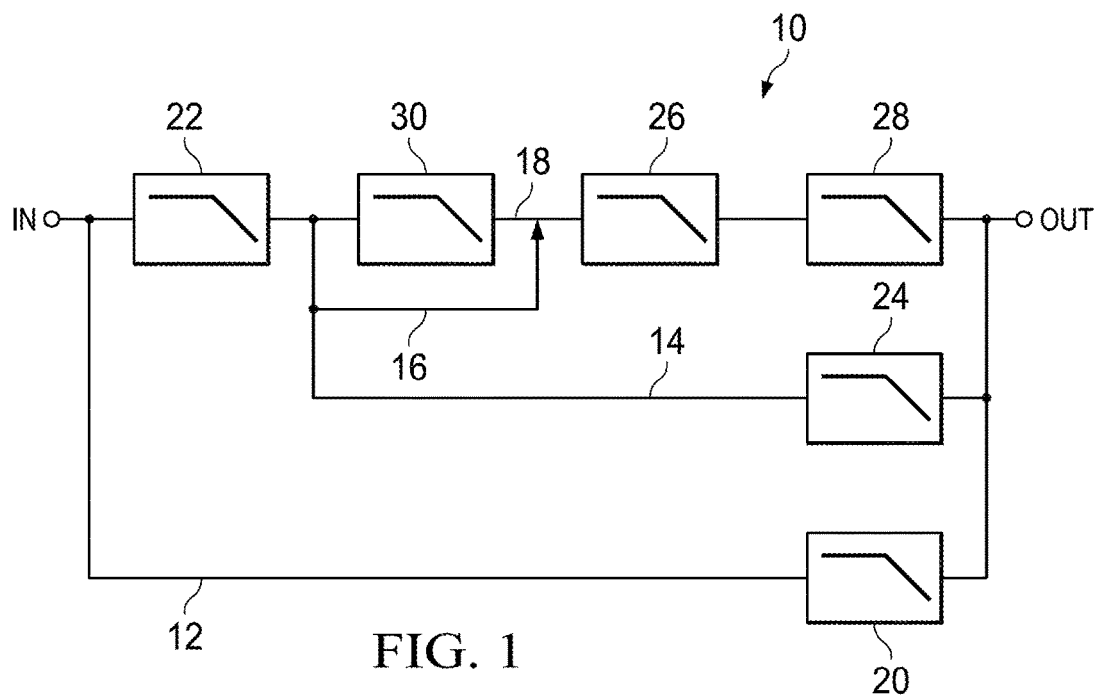
FIG. 1 is a schematic block diagram of an exemplary multipath feedforward low pass amplifier according to various aspects of the present disclosure.

By implementing band pass resonators, various multipath feedforward amplifiers described herein can achieve high gains at high frequencies, such as radio frequencies (for example, ranging from about 2 GHz to about 3 GHz). An exemplary multipath feedforward band pass amplifier includes a plurality of amplification stages configured to form at least partially distinct amplification paths extending from an input terminal to an output terminal, each amplification path defined by a respective subset of the plurality of amplification stages, wherein at least one amplification stage is a band pass resonator. In various implementations, multipath feedforward amplifier can maximize gain at a frequency of interest with an amplification path that cascades band pass resonators. In some implementations, each of the plurality of amplification stages is a band pass resonator. In various implementations, the multipath feedforward band pass is configured to optimize gain at a center frequency ranging from about 2 GHz to about 3 GHz, such as 2.5 GHz. Various low amplification stages and band pass amplification stages can be combined to configure the amplification paths to achieve such optimization. For example, in some implementations, at least one amplification path is defined by a first amplification stage, at least one middle amplification stage, and a last amplification stage connected in series, wherein the at least one middle amplification stage includes a band pass resonator. In some implementations, the first amplification stage and the last amplification stage are low pass amplifiers, such as first order transconductance amplifiers.

In some implementations, the band pass resonator is an active Gm-C circuit. An input transconductor stage of the band pass resonator can be configured to exhibit a negative transconductance. In some implementations, each amplification stage has an AC coupled input, and/or each amplification stage may be biased by a constant transconductance biasing circuit. For example, in some implementations, a biasing servo loop includes a first amplifier and a second amplifier configured to regulate a drain to source voltage of biasing transistors. The biasing servo loop may be configured to set a current-source transistor bias and a DC bias. In some implementations, each amplification stage includes an transistor-level amplification topology selected from a group consisting of a differential pair of transistors, a pseudo differential pair of transistors, a complementary differential pair of transistors, and a complementary pseudo differential pair of transistors. In some implementations, a first-order amplification path is configured to achieve a positive common mode gain that dominates an overall common mode gain of the multipath feedforward band pass amplifier to achieve stability.

DETAILED DESCRIPTION OF EXAMPLE EMBODIMENTS

RF to bits conversion (RF-to-bits) is the essence of wireless communications. Modern process technologies are giving rise to radio frequency (RF) analog-to-digital converters (ADCs) that can process ever higher frequencies. For example, RF ADCs currently being developed target a center frequency that ranges from about 2 GHz to about 3 GHz, which is an important frequency band for wireless communication standards. To optimize RF ADC processing, amplifiers need to provide sufficiently high gain at such frequencies to effectively condition RF signals. Balancing high gain and high speed has always been a difficult engineering problem. High speed processing calls for modern process technologies continual scaling (for example, from 32 nm process nodes to 28 nm process nodes and beyond). However, such scaling trends will eventually reach an end, and scaling does not necessarily improve or increase processing speed. For example, recent studies show next-generation 16 nm FinFET technologies exhibit slower transit frequencies than 28 nm CMOS technologies. Moreover, scaled process nodes mostly implement processing components, such as transistors, that exhibit low intrinsic gains, limiting gains achieved by conventional amplifiers. In an effort to further push the gain bandwidth envelope for high frequency signals, modern process technologies are beginning to explore non-conventional amplifier architectures that can achieve high speed and high gain using low intrinsic gain devices.

One technique for achieving high speed and high gain amplifiers using low intrinsic gain devices is to implement a multipath feedforward topology, such as various multipath feedforward amplifier topologies described in U.S. Pat. No. 8,102,206 and U.S. Pat. No. 8,536,969, the entire disclosures of which are incorporated herein by reference. Generally, multipath feedforward amplifiers can achieve higher gain using different amplification paths in parallel, where each amplification path includes at least one amplification stage. Implementing such topologies requires carefully managing crossover frequencies of the amplification paths (a highest frequency for which the amplification paths can respond) so that the gains achieved by each amplification path can be stacked in a manner that optimizes gain over a frequency range, optimizes gain at a frequency of interest within the frequency range, and ensures loop stability. Such is true for any amplifier since an amplifier's speed is often limited by its fastest gain stage. Namely, for a multipath feedforward amplifier having N-order amplification paths (where N is a total number of amplification paths of the multipath feedforward amplifier), a high-order feedforward transfer function can be represented as:

Total Gain=Gain 1st Path+Gain 2nd Path+Gain 3rd Path+Gain $4^{th}$ Path+ . . . Gain Nth Path.

where a loop gain of each path is a phasor. As an order of the amplification paths increases, there is a plethora of different ways to construct the feedforward transfer function. Amplification stage sharing (including at least partially sharing amplification stages among the amplification paths and/or at least partially sharing amplification stages) is a natural procedure for improving power efficiency and maintaining speed of the multipath feedforward amplifier. For example, where a second-order multipath feedforward amplifier implements a stage sharing compensation strategy, the second-order multipath feedforward amplifier may include a first amplification path that includes a first amplification stage and a second amplification path that shares the first amplification stage and further includes a second amplification stage. A second-order feedforward transfer function can be represented as:

Total Gain=$G1(k+G2)$, where G1 represents a gain of the first amplification stage (which is a faster of the two amplification stages), G2 represents a gain of the second amplification stage, and k is a sharing coefficient. In some implementations, k may be close to 1. Higher order multipath feedforward amplifiers can be constructed using the stage sharing compensation strategy by recursively replacing G2 with another $2^{nd}$ order system having equal or slower speed. In such scenarios, where each amplification stage is a first order system (such as a first-order low pass amplifier), a high-order feedforward transfer function can be represented as:

Total Gain=$G1(k1+G2(k2+G3(k3+G4( . . . ))))$ where G1 represents a gain of a first amplification stage (which is a fastest of the amplification stages), G2 represents a gain of a second amplification stage, G3 represents a gain of a third amplification stage, G4 represents a gain of a fourth amplification stage, and so on; and further where k1, k2, k3, and so on represent respective sharing coefficients. A crossover frequency from G1 to GN (such as G4) is often scaled down to ensure stability.

FIG. 1 is a block diagram of an exemplary multipath feedforward low pass amplifier 10, which implements amplification stage sharing, according to various aspects of the present disclosure. Multipath feedforward low pass amplifier 10 is an electronic device (including an electronic circuit and/or one or more components) configured to increase a signal property (for example, current, voltage, power, other signal property, or a combination thereof) of an incoming electrical signal. FIG. 1 has been simplified for the sake of clarity to better understand the inventive concepts of the present disclosure. Additional features can be added in multipath feedforward low pass amplifier 10, and some of the features described below can be replaced or eliminated in other embodiments of multipath feedforward low pass amplifier 10.

Multipath feedforward low pass amplifier 10 includes distinct amplification paths in parallel, where each amplification path can contribute a different frequency response and some amplification paths can be designed to bypass or feedforward past other amplification paths at selected frequencies. In FIG. 1, multipath feedforward low pass amplifier 10 depicts a fourth-order multipath feedforward low pass amplifier that includes successively higher-order amplification paths between an input terminal IN and an output terminal OUT, such as a first-order amplification path 12, a second-order amplification path 14, a third-order amplification path 16, and a fourth-order amplification path 18. Each amplification path can be partially distinct and/or partially overlapping with other amplification paths.

Each amplification path is defined by at least one low pass amplification stage, where each amplification stage (gain stage) represents a gain block that has a first order frequency response within a frequency range of interest. In FIG. 1, each low pass amplification stage is a low pass amplifier, which can be achieved by a voltage-to-current amplifier (for example, a transconductance amplifier), a voltage-to-voltage amplifier, a current-to-current amplifier, a current-to-voltage amplifier, or a combination thereof. In some implementations, each low pass amplifier is a first-order low pass amplifier, which can be implemented as a transconductance amplifier having an associated transconductance ($g_m$). Each low pass amplifier can achieve some gain from DC to a crossover frequency (FC) (a highest frequency for which the amplifier can respond), where the gain dies down to 0 dB at the crossover frequency.

In the depicted embodiment, a low pass amplifier 20, a low pass amplifier 22, a low pass amplifier 24, a low pass amplifier 26, a low pass amplifier 28, and a low pass amplifier 30 are configured to define the various amplification paths. First-order amplification path 12 includes a single amplifier, low pass amplifier 20, connected between input terminal IN and output terminal OUT. Second-order amplification path 14 includes two amplifiers, low pass amplifier 22 and low pass amplifier 24, connected in series between input terminal IN and output terminal OUT. Third-order amplification path 16 includes three amplifiers, low pass amplifier 22, low pass amplifier 26, and low pass amplifier 28, connected in series between input terminal IN and output terminal OUT. Fourth-order amplification path 18 includes four amplifiers, low pass amplifier 22, low pass amplifier 26, low pass amplifier 28, and low pass amplifier 30, connected in series between input terminal IN and output terminal OUT. Multipath feedforward low pass amplifier 10 can include higher-order amplification paths, where each higher-order amplification path includes a number of amplifiers equal to a degree of its order.

As noted, multipath feedforward low pass amplifier 10 implements amplification stage sharing. For example, in the depicted embodiment, a first low pass amplification stage of second-order amplification path 14, third-order amplification path 16, and fourth-order amplification path 18 is a same amplifier, low pass amplifier 22. Further, a second low pass amplification stage and a third low pass amplification stage of third-order amplification path 16 is a same amplifier as a third low pass amplification stage and a fourth low pass amplification stage of fourth-order amplification path 18, such that third-order amplification path 16 and fourth-order amplification path 18 share low pass amplifier 26 and low pass amplifier 28. The present disclosure contemplates other amplification stage sharing configurations, noting that the depicted embodiment is merely for illustration. Furthermore, the present disclosure contemplates sharing among amplification stages within an amplification path, in some implementations. In various implementations, each amplifier, each amplification stage, and/or each amplification path of multipath feedforward low pass amplifier 10 can be single-ended, differential, or partially-single-ended and partially-differential.

First-order amplification path 12, second-order amplification path 14, third-order amplification path 16, and fourth-order amplification path 18 each have an associated crossover frequency. Typically, a crossover frequency associated with first-order amplification path 12 sets an approximate crossover frequency of multipath feedforward low pass amplifier 10. In RF applications, since a frequency of interest (F0) is often high, multipath feedforward low pass amplifier 10 is configured to elevate gain as rapidly as possible from the crossover frequency (FC) to the frequency of interest (in other words, from FC to F0). For example, in various implementations, multipath feedforward low pass amplifier 10 can maximize its crossover frequency to about 10 GHz using existing technology. Where a frequency of interest (F0) is about 2.5 GHz, multipath feedforward low pass amplifier 10 can be configured to maximize gain at 2.5 GHz (the frequency of interest) from about 10 GHz. Though fourth-order multipath feedforward low pass amplifier 10 can achieve gain at the frequency of interest by selectively combining different frequency responses of its associated amplification paths, the small frequency ratios between the frequency of interest and crossover frequency that often arise in RF applications (here, 2.5 GHz to 10 GHz, where the crossover frequency is only four times higher than the frequency of interest) leaves little room for reconfiguring and selectively combining the amplification paths to further improve gain at the frequency of interest while maintaining stability. This can prevent multipath feedforward low pass amplifier 10 from achieving sufficiently high gains for high frequency applications, such as RF applications.

Figure 2:
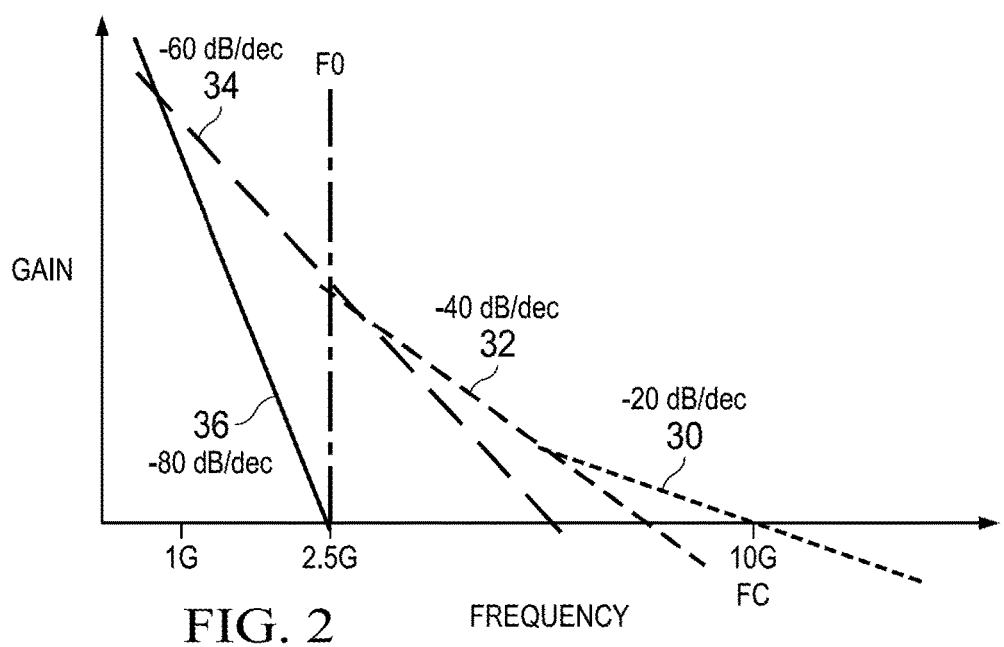
FIG. 2 is a graph depicting gain over frequency achieved by a multipath feedforward low pass amplifier according to various aspects of the present disclosure.

FIG. 2 is a graph depicting gain achieved over frequency by a multipath feedforward amplifier, such as multipath feedforward low pass amplifier 10, according to various aspects of the present disclosure. A line 30 represents loop gain achieved over frequency by first-order amplification path 12, a line 32 represents loop gain achieved over frequency by second-order amplification path 14, a line 34 represents loop gain achieved over frequency by third-order amplification path 16, and a line 36 represents loop gain achieved over frequency by fourth-order amplification path 18. Line 30, line 32, line 34, and line 36 indicate that each amplification path achieves a gain that decreases as the frequency increases. In FIG. 2, multipath feedforward low pass amplifier 10 achieves a loop gain for frequencies less than or equal to about 10 GHz, where 10 GHz is the crossover frequency. In various implementations, multipath feedforward low pass amplifier 10 achieves the depicted loop gains for the frequency range by line 30 having a loop gain slope of about −20 dB/decade (where first-order amplification path 12 has an associated −90° phase shift), line 32 having a loop gain slope of about −40 dB/decade (where second-order amplification path 14 has an associated −180° phase shift), line 34 having a loop gain slope of about −60 dB/decade (where third-order amplification path 16 has an associated −270° phase shift), and line 36 having a loop gain slope of about −80 dB/decade (where fourth-order amplification path 18 has an associated −360° phase shift). From FIG. 2, it is evident that multipath feedforward low pass amplifier 10 can elevate gain from the crossover frequency (here, 10 GHz) to some lower frequency of interest (here, 2.5 GHz) by stacking the gains achieved by each amplification path with crossover frequency scaling. By stacking the gains, multipath feedforward amplifier 10 achieves a higher gain for the frequency of interest (here, 2.5 GHz) than would be achieved by first-order amplification path 12 or second-order amplification path 14 alone. Namely, when extrapolated towards 2.5 GHz (here, the frequency of interest), line 30 and line 32 would cross 2.5 GHz at a lower gain than line 34. Third-order amplification path 16 thus achieves a higher gain at the frequency of interest than first-order amplification path 12 or second-order amplification path 14 could alone, or together if multipath feedforward low pass amplifier 10 were configured as a second-order multipath feedforward low pass amplifier.

It has been observed that, though multipath feedforward low pass amplifier 10 can achieve higher gains at high frequencies of interest (such as 2.5 GHz) than conventional amplifier configurations, these gains are still not sufficient for some RF applications. For example, though multipath feedforward low pass amplifier 10 can achieve gains as high as about 20 dB for high frequencies of interest (here, from about 2 GHz to about 3 GHz), some RF applications need even higher gains, such as at least 40 dB gain, at these frequencies of interest. Such RF applications also typically call for narrower frequency bands around the frequency of interest, such as about 100 Mhz frequency band centered by the frequency of interest. Simply implementing a higher-order amplification path does not necessarily boost the gain any higher than that achieved by the third-order amplification path 16 of multipath feedforward low-pass amplifier 10. In fact, higher order amplification paths may exhibit negative gain at the frequency of interest because of the crossover frequency scaling needed to stack the gains. Such can be seen in FIG. 2, where fourth-order amplification path 18 realizes a negative gain at 2.5 GHz. Further, as noted, given the small frequency ratio between the frequency of interest (here, 2.5 GHz) and the crossover frequency (here, 10 GHz), there is little room, particularly in high RF frequency applications, for configuring the amplification paths in a manner that can further boost the gain while maintaining Nyquist stability criterion. For example, to maintain stability of multipath feedforward low pass amplifier 10, each higher-order amplification path is scaled back in frequency to ensure that the higher-order amplification paths have crossover frequencies less than the first-order amplification path. Further, practically, some amplification stages may exhibit low gain, where its associated 3 dB bandwidth is above the frequency of interest, thus contributing less gain than what is theoretically possible. Moreover, in various applications, crossover frequency reduction caused by closed feedback loop configurations present additional challenges to configuring multipath feedforward low pass amplifier 10 in a manner that can sufficiently boost gain for some RF applications.

The present disclosure recognizes that such issues can be remedied by designing a multipath feedforward amplifier that can achieve a gain that rises quickly from the crossover frequency to the frequency of interest, while maintaining a stable frequency response in feedback configurations. A multipath feedforward band pass amplifier topology is thus proposed that can achieve gain sooner. Specifically, the present disclosure recognizes that, unlike the low pass amplification stages described above, a band pass resonator achieves a gain that rises rapidly from the crossover frequency to the frequency of interest. Band pass resonators can thus be implemented as amplification stages in the multipath feedforward amplifier to achieve a gain that rises quickly from the crossover frequency to the frequency of interest. Such multipath feedforward band pass amplifiers can achieve high gain for high frequencies, such as high frequency RF signals, using the low gain intrinsic components implemented in modern process technologies' scaled process nodes. Further, implementing band pass resonators can increase a bandwidth of a frequency range for which the multipath feedforward amplifier can achieve high gain. In some implementations, multipath feedforward band pass amplifiers can cascade band pass resonators to achieve even higher gains for a frequency of interest. Different embodiments may have different advantages, and no particular advantage is necessarily required of any of the embodiments described herein.

From a gain perspective, any resonator (low pass, band pass, or combined) with a same Q offers a same gain. However, each resonator exhibits a different phase response. A band pass resonator has a symmetrical frequency response on both sides of its center frequency (resonate frequency), such that a frequency compensated on a right side of the center frequency is also compensated for on a left side of the center frequency. In essence, the band pass resonator squeezes gain towards the center frequency, optimizing the gain that can be achieved at the center frequency. When implemented as an amplification stage, since the band pass resonator's phase is −90° on a high frequency side of the center frequency, a same as a low pass amplification stage (such as that described above), the band pass resonator can seamlessly integrate into the amplification stage sharing compensation architectures described above. Further, since the compensated phase response is mirrored on a low frequency side of the center frequency (+90°), a transfer function of the multipath feedforward band pass amplifier can be guaranteed to satisfy Nyquist stability criterion. The band pass resonator's phase response thus offers advantages for achieving a rapidly rising gain while maintaining stability.

Figure 3:
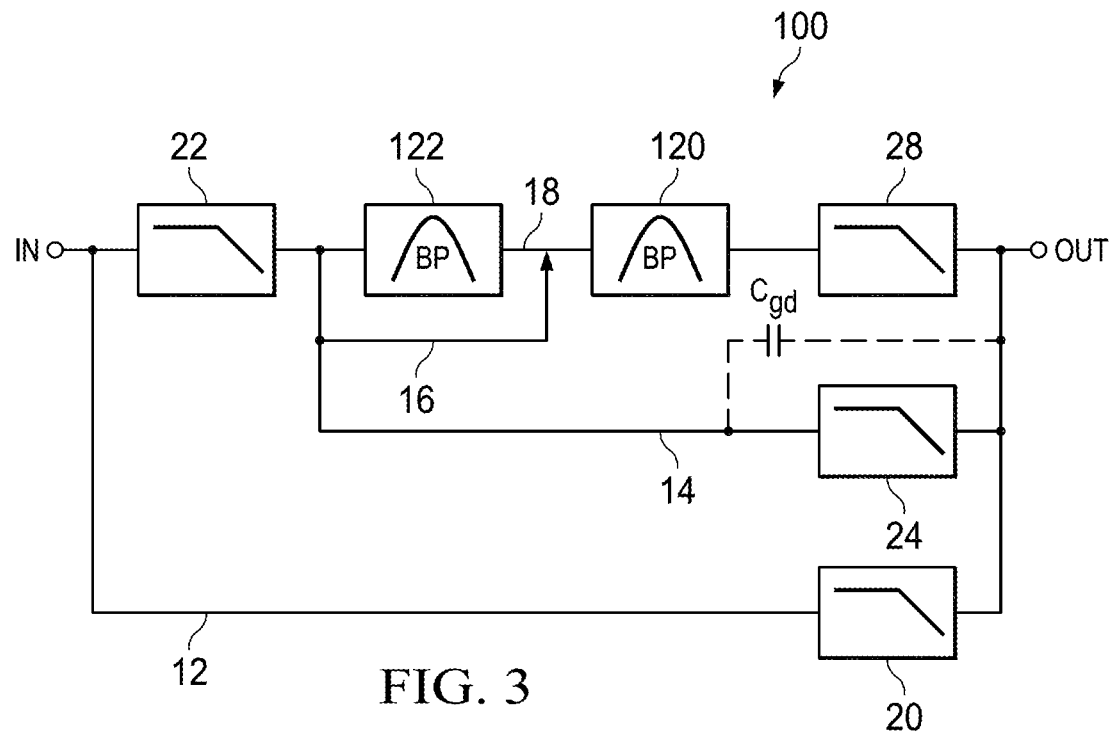
FIG. 3 is a schematic block diagram of an exemplary multipath feedforward band pass amplifier according to various aspects of the present disclosure.

FIG. 3 is a block diagram of an exemplary multipath feedforward band pass amplifier 100 according to various aspects of the present disclosure. Multipath feedforward band pass amplifier 100 is an electronic device (including an electronic circuit and/or one or more components) configured to increase a signal property (for example, current, voltage, power, other signal property, or a combination thereof) of an incoming electrical signal. The embodiment of FIG. 3 is similar in many respects to the embodiment of FIG. 1. Accordingly, similar features in FIG. 1 and FIG. 3 are identified by the same reference numerals for clarity and simplicity. FIG. 3 has been simplified for the sake of clarity to better understand the inventive concepts of the present disclosure. Additional features can be added in multipath feedforward band pass amplifier 100, and some of the features described below can be replaced or eliminated in other embodiments of multipath feedforward band pass amplifier 100.

Similar to multipath feedforward low pass amplifier 10, multipath feedforward band pass amplifier 100 includes distinct amplification paths in parallel, where each amplification path can contribute a different frequency response and some amplification paths can be designed to bypass or feedforward past other amplification paths at selected frequencies. In FIG. 3, multipath feedforward band pass amplifier 100 depicts a fourth-order multipath feedforward band pass amplifier that includes successively higher-order amplification paths between input terminal IN and output terminal OUT, such as first-order amplification path 12, second-order amplification path 14, third-order amplification path 16, and fourth-order amplification path 18. Each amplification path can be partially distinct and/or partially overlapping with other amplification paths.

Each amplification path is also defined by at least one amplification stage. In contrast to multipath feedforward low pass amplifier 10, multipath feedforward band pass amplifier 100 defines amplification paths using a combination of low pass amplification stages (where each low pass amplification stage (gain stage) represents a gain block that has a first order frequency response within a frequency range of interest) and band pass amplification stages (such as a second order resonator, as described below). In FIG. 3, each low pass amplification stage is a low pass amplifier, and each band pass amplification stage is a band pass resonator. For example, multipath feedforward band pass amplifier 100 includes a band pass resonator 120 and a band pass resonator 122, along with low pass amplifier 20, low pass amplifier 22, low pass amplifier 24, and low pass amplifier 28, configured to define the various amplification paths. Each band pass resonator can achieve some gain within a frequency range, maximizing gain at a center frequency. In the depicted embodiment, a first amplification stage and a last amplification stage of each amplification path is a low pass amplification stage, and any middle amplification stages of each amplification path are band pass amplification stages. First-order amplification path 12 includes a single low pass amplification stage, such as low pass amplifier 20 connected between input terminal IN and output terminal OUT. Second-order amplification path 14 includes two low pass amplification stages, such as low pass amplifier 22 and low pass amplifier 24 connected in series between input terminal IN and output terminal OUT. Third-order amplification path 16 includes two low pass amplification stages and one band pass amplification stage, such as low pass amplifier 22, band pass resonator 120, and low pass amplifier 28 connected in series between input terminal IN and output terminal OUT. Fourth-order amplification path 18 includes two low pass amplification stages and two band pass amplification stages, such as low pass amplifier 22, band pass resonator 122, band pass resonator 120, and low pass amplifier 28 connected in series between input terminal IN and output terminal OUT. Multipath feedforward band pass amplifier 100 can include higher-order amplification paths, where each higher-order amplification path includes a number of amplification stages equal to a degree of its order.

Multipath feedforward band pass amplifier 100 also implements amplification stage sharing. For example, in the depicted embodiment, a first amplification stage of second-order amplification path 14, third-order amplification path 16, and fourth-order amplification path 18 is a same amplifier, low pass amplifier 22. Further, a band pass amplification stage and a low pass amplification stage of third-order amplification path 16 is a same as a band pass amplification stage and a low pass amplification stage of fourth-order amplification path 18, such that third-order amplification path 16 and fourth-order amplification path 18 share band pass resonator 120 and low pass amplifier 28. The present disclosure contemplates other amplification stage sharing configurations, noting that the depicted embodiment is merely for illustration. Further, the present disclosure contemplates sharing among amplification stages within an amplification path, in some implementations. In various implementations, each amplifier, each amplification stage, and/or each amplification path of multipath feedforward band pass amplifier 100 can be single-ended, differential, or partially-single-ended and partially-differential.

The low pass amplification stages and band pass amplification stages are combined in a manner that satisfies Nyquist stability criterion. For example, in the depicted embodiment, band pass amplification stages are implemented as middle amplification stages of each amplification path, where the low pass amplification stages and band pass amplification stages are configured for achieving high gain while maintaining stability. The present disclosure also contemplates multipath feedforward band pass amplifier configurations that implement a band pass resonator in all amplification stages, or in amplification stages other than the middle amplification stages as depicted. In some implementations, an amplification stage can have an associated compensation capacitor, which can be configured to cancel out any Miller capacitance. For example, in the depicted embodiment, a compensation capacitor $C_{gd}$ is connected to an input and output of a last amplification stage (here, low pass amplifier 24) of second-order amplification path 14 in reversed polarity.

Figure 4:
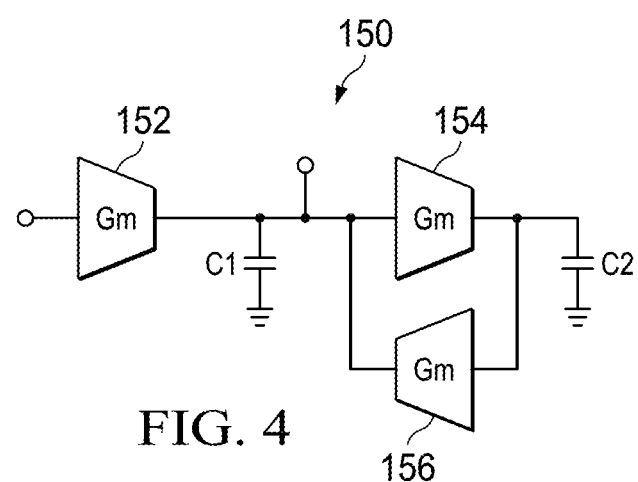
FIG. 4 is a schematic circuit diagram of an exemplary band pass resonator, which can be implemented as a band pass amplification stage in a multipath feedforward band pass amplifier, according to various aspects of the present disclosure.

FIG. 4 is a schematic circuit diagram of an exemplary band pass resonator 150 according to various aspects of the present disclosure. Band pass resonator 150 is configured as an active second-order Gm-C filter In the depicted embodiment, band pass resonator 150 includes a capacitor C1, a capacitor C2, and three first-order gain blocks—a transconductance amplifier 152 having an associated transconductance $G_m$, a transconductance amplifier 154 having an associated transconductance $G_{m1}$, and a transconductance amplifier 156 having an associated transconductance $G_{m2}$. Transconductance amplifier 152 can form a first transconductance stage, and transconductance amplifier 154 connected in parallel to transconductance amplifier 156 can form a second transconductance stage. A second-order transfer function associated with band pass resonator 150 can be represented as:

$$\frac{\frac{S}{\omega_0}}{1+\frac{S}{Q\omega_0}+\frac{S^2}{\omega_0^2}}$$

where $\omega_0$ is a resonate frequency (center frequency) of band pass resonator 150 and Q is a quality factor (which characterizes a bandwidth of band pass resonator 150 relative to its resonate frequency). In various implementations, assuming no output resistance, the second-order transfer function associated with band pass resonator 150 can be represented as:

$$\frac{V_{out}}{V_{in}}=\frac{\frac{C2}{G_{m1}G_{m2}}\times S}{1+\frac{C1\times C2\times S^2}{G_{m1}G_{m2}}}$$

As configured, the back-to-back transconductance stages of band pass resonator 100 provide positive feedback. FIG. 4 has been simplified for the sake of clarity to better understand the inventive concepts of the present disclosure. Additional features can be added in band pass resonator 150, and some of the features described below can be replaced or eliminated in other embodiments of band pass resonator 150.

Band pass resonator 150 exhibits a positive feedback transconductance loop that effectively forms an active inductor, such that band pass resonator 150 can be achieved without implementing inductors, which can consume larger than desirable device area. Various parameters associated with band pass resonator 150 can be designed to achieve desired gain at desired frequencies, including a center frequency (Fc), a Q factor, a gain, and a 3 dB bandwidth. In theory, the Q factor can be infinitely high. However, even if an infinitely high Q factor can be achieved, the high Q factor does not guarantee that band pass resonator 150 can achieve sufficiently high gain for an entire frequency range of interest, particularly the narrower frequency bands (such as about 100 MHz) around the high frequencies of interest (such as from about 2 GHz to about 3 GHz) needed for RF applications. To combat such phenomena in multipath feedforward band pass amplifier topologies, an amplification path can cascade more than one band pass resonator 150 to achieve rapidly rising and sufficiently high gain for a wider frequency range. For example, in FIG. 3, multipath feedforward band pass amplifier 100 cascades band pass resonators to achieve sufficiently high gain over a larger frequency bandwidth. For example, in fourth-order amplification path 18, band pass resonator 120 and band pass resonator 122 are cascaded in a manner that can achieve sufficiently high gain for a wider frequency range, each of which can be configured as band pass resonator 150. In various implementations, multipath feedforward band pass amplifier 100 can achieve sufficiently high gain for a center frequency of about 2.5 GHz to about 3.0 GHz over a sufficiently large frequency range. For example, in some implementations, it has been observed that multipath feedforward band pass amplifier 100 can achieve a gain equal to or larger than about 40 dB for a 100 MHz frequency band with a center frequency of about 2.5 GHz.

Figure 5A:
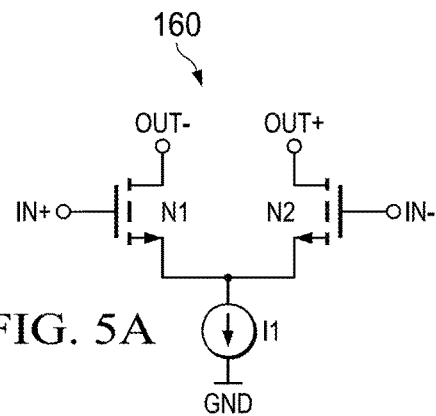
FIG. 5A, FIG. 5B, FIG. 5C, and FIG. 5D are schematic circuit diagrams of exemplary transistor-level amplification topologies, which can be implemented as an amplification stage of a multipath feedforward amplifier, according to various aspects of the present disclosure.
Figure 5B:
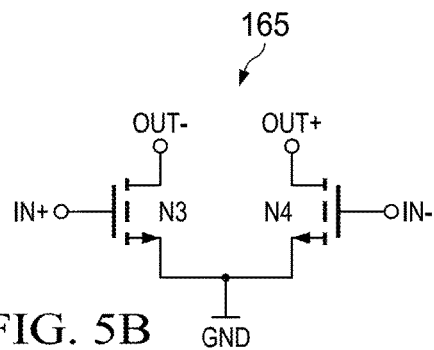
Figure 5C:
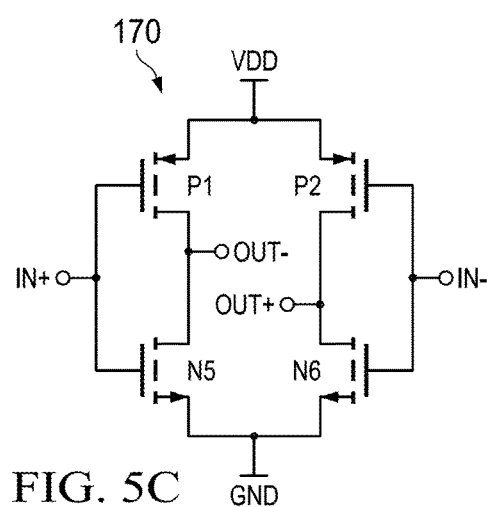
Figure 5D:
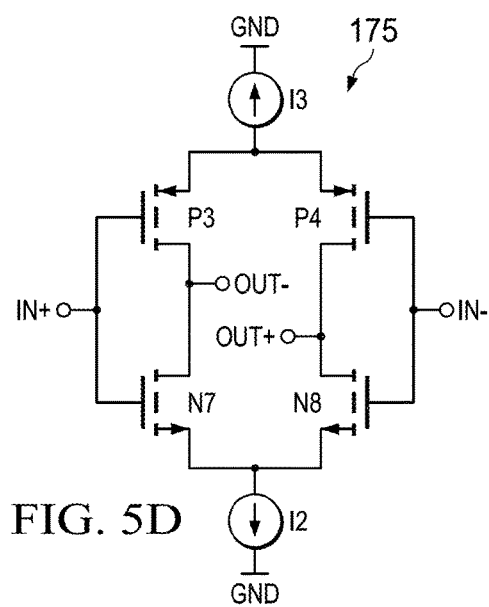

In various implementations, each transconductance amplifier (transconductance amplifier 152, transconductance amplifier 154, and transconductance amplifier 156) of band pass resonator can be implemented using a transistor-level amplification topology. Since band pass resonator 150 exhibits positive feedback and stage sharing is implemented in multipath feedforward band pass amplifier topologies, one must carefully choose an amplification transistor topologies for each transconductance amplifier. FIG. 5A, FIG. 5B, FIG. 5C, and FIG. 5D depict exemplary transistor-level first order amplification topologies that can be used to implement transconductance amplifiers, such as the transconductance amplifiers of band pass resonator 150 of FIG. 4, according to various aspects of the present disclosure. FIG. 5A depicts an exemplary differential transistor-level amplification topology 160, FIG. 5B depicts an exemplary pseudo differential transistor-level amplification topology 165, FIG. 5C depicts an exemplary complementary pseudo differential transistor-level amplification topology 170, and FIG. 5D depicts an exemplary complementary differential transistor-level amplification topology 175. The depicted amplification transistor topologies can be implemented in conjunction with further circuitry to achieve the transconductance amplifiers, such as common-mode circuitry configured to control DC voltage levels at various amplifier circuit nodes, load transistor circuitry, current source transistor circuitry, and/or other circuitry for realizing the transconductor amplifiers described herein. The present disclosure also contemplates using the various transistor-level first order amplification topologies as building blocks for the low pass amplification stages and/or band pass amplification stages as described herein depending on various design considerations. FIG. 5A, FIG. 5B, FIG. 5C, and FIG. 5D have been simplified for the sake of clarity to better understand the inventive concepts of the present disclosure. Additional features can be added in amplifier transistor topologies 160, 165, 170, and 175, and some of the features described below can be replaced or eliminated in other embodiments of amplifier transistor topologies 160, 165, 170, and 175. For example, bandwidth limiting capacitances at outputs of the amplifier transistor topologies have not been depicted for simplicity purposes.

In FIG. 5A, differential transistor-level amplification topology 160 includes a differential pair of NMOS amplification transistors, an NMOS amplification transistor N1 and an NMOS amplification transistor N2. NMOS amplification transistor N1 and NMOS amplification transistor N2 have gates respectively connected to a positive input terminal IN+ and a negative input terminal IN−, drains respectively connected to a positive output terminal OUT+ and a negative output terminal OUT−, and sources connected to a current source I1. In various implementations, current source I1 can be implemented using a current-source transistor configuration. In FIG. 5B, pseudo differential transistor-level amplification topology 165 includes a pseudo differential pair of NMOS amplification transistors, an NMOS amplification transistor N3 and an NMOS amplification transistor N4. NMOS amplification transistor N3 and NMOS amplification transistor N4 have gates respectively connected to a positive input terminal IN+ and a negative input terminal IN−, drains respectively connected to a positive output terminal OUT+ and a negative output terminal OUT−, and sources connected to a fixed voltage (for example, ground (GND)). Although differential transistor-level amplification topology 160 and pseudo differential transistor-level amplification topology 165 depict NMOS amplification transistor configurations, the present disclosure contemplates corresponding PMOS versions of the differential transistor-level amplification topology 160 and pseudo differential transistor-level amplification topology 165, in various implementations.

In FIG. 5C, complementary pseudo differential transistor-level amplification topology 170 includes a pseudo differential pair of NMOS amplification transistors, an NMOS amplification transistor N5 and an NMOS amplification transistor N6, and a pseudo differential pair of PMOS amplification transistors, a PMOS amplification transistor P1 and a PMOS amplification transistor P2. NMOS amplification transistor N5 and NMOS amplification transistor N6 have gates respectively connected to a positive input terminal IN+ and a negative input terminal IN−, drains respectively connected to a positive output terminal OUT+ and a negative output terminal OUT−, and sources connected to a reference voltage, such as ground (GND). Similarly, PMOS amplification transistor P1 and PMOS amplification transistor P2 have gates respectively connected to a positive input terminal IN+ and a negative input terminal IN−, drains respectively connected to a positive output terminal OUT+ and a negative output terminal OUT−, and sources connected to a reference voltage, such as a power supply (VDD). In FIG. 5D, complementary differential transistor-level amplification topology 175 includes a differential pair of NMOS amplification transistors, an NMOS amplification transistor N7 and an NMOS amplification transistor N8, and a differential pair of PMOS amplification transistors, a PMOS amplification transistor P3 and a PMOS amplification transistor P4. NMOS amplification transistor N7 and NMOS amplification transistor N8 have gates respectively connected to a positive input terminal IN+ and a negative input terminal IN−, drains respectively connected to a positive output terminal OUT+ and a negative output terminal OUT−, and sources connected to a current source 12. Similarly, PMOS amplification transistor P3 and PMOS amplification transistor P4 have gates respectively connected to a positive input terminal IN+ and a negative input terminal IN−, drains respectively connected to a positive output terminal OUT+ and a negative output terminal OUT−, and sources connected to a current source 13. In various implementations, current source 12 and current source 13 can be implemented using a current-source transistor configuration. In various implementations, gates of NMOS amplification transistors and PMOS amplification transistors can instead be separated by voltage sources or AC coupling capacitors.

Returning to FIG. 4, when designing band pass resonator 150, an transistor-level amplification topology for each transconductance amplifier (transconductance amplifier 152, transconductance amplifier 154, and transconductance amplifier 156) is carefully selected depending on various considerations including desired voltage swing, linearity, transconductance, and common mode gain. For example, to minimize voltage swing or ensure a small common mode gain, differential transistor-level amplification topology 160 can be implemented as a transconductance amplifier. In another example, where a large common mode gain is desired, pseudo differential transistor-level amplification topology 165 or complementary pseudo differential transistor-level amplification topology 170 can be implemented as the transconductance amplifier. In yet another example, where more transconductance is desired, complementary pseudo differential transistor-level amplification topology 170 or complementary differential transistor-level amplification topology 175 can be implemented as the transconductance amplifier.

In various implementations, each amplification stage is AC coupled, isolating a DC component of an input signal to the amplification stage, such that the amplification stage can process an AC component of the input signal. In some implementations, the AC coupling can isolate an output from one amplification stage from an input of a subsequent amplification stage, allowing different biasing of the input of the subsequent amplification stage and gate voltages of the subsequent amplification stage. Further, in various implementations, due to the band pass nature and/or AC nature of a multipath feedforward band pass amplifier, biasing can be implemented using passive components, which can maintain and/or enhance high speed processing of the multipath feedforward band pass amplifier. For example, resistors can be used to set a differential pairs' DC bias point, while AC inputs can be connected via bypass capacitors. Common mode feedback for each transconductance amplifier can also be set up in a similar way, so that an active load works as a pseudo differential pair, preventing its transconductance from being wasted.

Figure 6A:
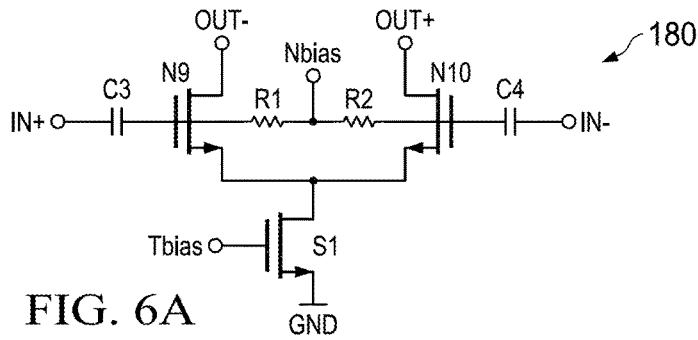
FIG. 6A and FIG. 6B are schematic circuit diagrams of exemplary transistor-level amplification topologies configured with AC coupling and/or passive biasing, which can be implemented as an amplification stage of a multipath feedforward amplifier, according to various aspects of the present disclosure.
Figure 6B:
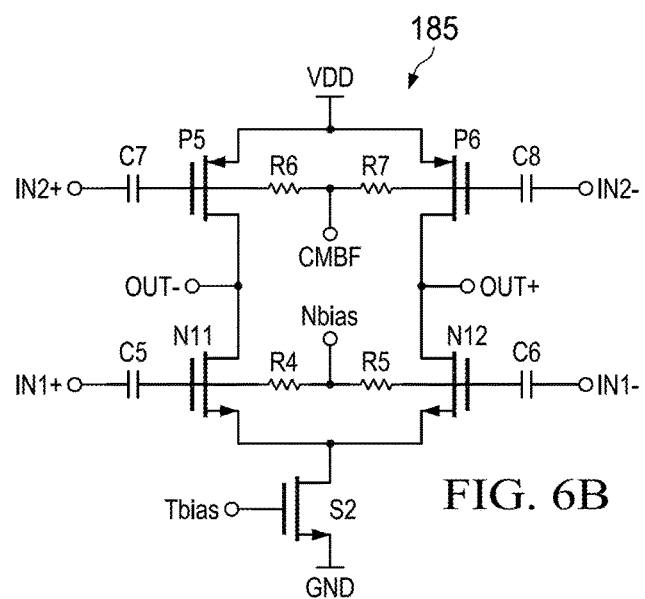

FIG. 6A and FIG. 6B are schematic circuit diagrams of exemplary transistor-level first order amplification topologies configured with AC coupling and/or passive biasing, which can be implemented in the various amplification stages of multipath feedforward band pass amplifier 100, according to various aspects of the present disclosure. In FIG. 6A, a transistor-level amplification topology 180 depicts a differential transistor-level amplification topology that can be implemented as a first amplification stage (or a pre-resonator amplification stage) of an amplification path in a multipath feedforward amplifier, such as low pass amplifier 20 in multipath feedforward band pass amplifier 100. A differential pair of NMOS amplification transistors, an NMOS amplification transistor N9 and an NMOS amplification transistor N10, has gates respectively connected to a positive input terminal IN+ and a negative input terminal IN−, drains respectively connected to a positive output terminal OUT+ and a negative output terminal OUT−, and sources connected to an NMOS current-source transistor S1. Each input is AC coupled—a capacitor C3 connected to positive input terminal IN+ and NMOS amplification transistor N9, and a capacitor C4 connected to negative input terminal IN− and NMOS amplification transistor N10. A resistor R1 and a resistor R2 can be configured to set a DC biasing point of the differential pair of NMOS amplification transistors. For example, resistor R1 is connected to a biasing voltage ($N_{bias}$) and a gate of NMOS amplification transistor N9, and resistor R2 is connected to the biasing voltage and NMOS amplification transistor N10. FIG. 6A has been simplified for the sake of clarity to better understand the inventive concepts of the present disclosure. Additional features can be added in transistor-level amplification topology 180, and some of the features described below can be replaced or eliminated in other embodiments of transistor-level amplification topology 180.

In FIG. 6B, an transistor-level amplification topology 185 depicts a complementary transistor-level amplification topology that can be implemented as an input stage of a band pass resonator configured as an amplification stage in a multipath feedforward amplifier, such as an input stage of band pass resonator 120 in multipath feedforward band pass amplifier 100. The complementary transistor-level amplification topology includes a differential pair of NMOS amplification transistors, an NMOS amplification transistor N11 and an NMOS amplification transistor N12, and a pseudo differential pair of PMOS amplification transistors, a PMOS amplification transistor P5 and a PMOS amplification transistor P6. NMOS amplification transistor N11 and NMOS amplification transistor N12 have gates respectively connected to a positive input terminal IN1+ and a negative input terminal IN1−, drains respectively connected to a positive output terminal OUT+ and a negative output terminal OUT−, and sources connected to a current-source transistor S2 having a gate connected to a biasing voltage ($T_{bias}$). Similarly, PMOS amplification transistor P5 and PMOS amplification transistor P6 have gates respectively connected to a positive input terminal IN2+ and a negative input terminal IN2−, drains respectively connected to negative output terminal OUT− and positive output terminal OUT+, and sources connected to a reference voltage, such as a power supply (VDD). Note that transistor-level amplification topology 185 is configured for amplification stage sharing. For example, when implemented as an input stage of band pass resonator 120 in multipath feedforward amplifier, band pass resonator 120 is shared among third-order amplification path 16 and fourth-order amplification path 18, such that input terminals IN1+ and IN1− can be connected to low pass amplifier 20, and input terminals IN2+ and IN2− can be connected to band pass resonator 122. Each input is AC coupled—a capacitor C5 is connected to positive input terminal IN1+ and NMOS amplification transistor N11, and a capacitor C6 is connected to negative input terminal IN1− and NMOS amplification transistor N12, a capacitor C7 is connected to positive input terminal IN2+ and PMOS amplification transistor P5, and a capacitor C8 is connected to negative input terminal IN2− and PMOS amplification transistor P6. A resistor R4 and a resistor R5 can be configured to set a DC biasing point of the differential pairs of amplification transistors, and a resistor R6 and a resistor R7 can be configured to set a common mode feedback bias. For example, resistor R4 is connected to a biasing voltage ($N_{bias}$) and a gate of NMOS amplification transistor N11, resistor R5 is connected to the biasing voltage and NMOS amplification transistor N12, resistor R6 is connected to a common mode feedback bias voltage (CMBF) and a gate of PMOS amplification transistor P5, and resistor R7 is connected to the common mode feedback bias voltage and PMOS amplification transistor P6. FIG. 6B has been simplified for the sake of clarity to better understand the inventive concepts of the present disclosure. Additional features can be added in transistor-level amplification topology 185, and some of the features described below can be replaced or eliminated in other embodiments of transistor-level amplification topology 185.

Figure 7:
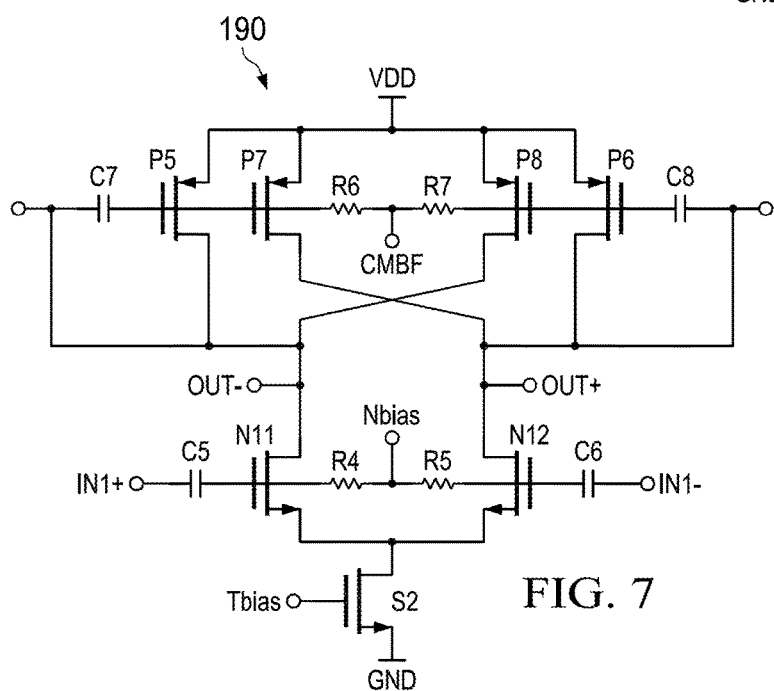
FIG. 7 is a schematic circuit diagram of an exemplary transistor-level amplification topology having a negative transconductance, which can be implemented as an amplification stage of a multipath feedforward amplifier, according to various aspects of the present disclosure.

In various implementations, because output impedances from each amplification stage tend to lower a Q factor of a band pass resonator, an input transconductance stage of a band pass resonator can be configured to achieve negative transconductance. For example, transconductance amplifier 152 of band pass resonator 150 can be configured to achieve a negative transconductance ($-G_m$), increasing the Q factor of the band pass resonator 150. In some implementations, it has been observed that, without using negative transconductance in the input transconductance stage, a gain of the band pass resonator may be about 10 dB lower than a first-order low pass amplification stage (such as low pass amplifier 22). FIG. 7 is a schematic circuit diagram of an exemplary transistor-level first order amplification topology 190 that exhibits a negative transconductance, which can be implemented as an amplification stage in multipath feedforward band pass amplifier 100, according to various aspects of the present disclosure. In various implementations, transistor-level first order amplification topology 190 can be implemented as an input transconductance stage (for example, transconductance amplifier 152) of band pass resonator 150. The embodiment of FIG. 7 is similar in many respects to the embodiment of FIG. 6B. Accordingly, similar features in FIG. 6B and FIG. 7 are identified by the same reference numerals for clarity and simplicity.

In FIG. 7, transistor-level amplification topology 190 depicts a complementary transistor-level amplification topology similar to transistor-level amplification topology 185, except that transistor-level amplification topology 190 further includes a pseudo differential pair of PMOS amplification transistors, PMOS amplification transistor P7 and PMOS amplification transistor P8, which have gates respectively connected to capacitor C7 and capacitor C8, drains respectively connected to positive output terminal OUT+ and negative output terminal OUT−, and sources connected to a reference voltage, such as a power supply (VDD). In the depicted embodiment, since the active load of transistor-level amplification topology 190 is cross-coupled, an input of transistor-level amplification topology 190 (input terminal IN1+ and input terminal IN1−) sees a negative transconductance. FIG. 7 has been simplified for the sake of clarity to better understand the inventive concepts of the present disclosure. Additional features can be added in transistor-level amplification topology 190, and some of the features described below can be replaced or eliminated in other embodiments of transistor-level amplification topology 190.

Since a resonance frequency (in other words, the center frequency) is dependent on the band pass resonator's transconductance and capacitance, to ensure proper operation of a multipath feedforward band pass amplifier implementing the band pass resonator, the band pass resonator's transconductance should be relatively constant. In various implementations, multipath feedforward band pass amplifier 100 implements a biasing scheme for ensuring that that its associated amplification transistors exhibit relatively constant transconductance, thus ensuring that the band pass resonator achieves desired gain at a desired center frequency. The present disclosure proposes a biasing servo loop for biasing amplification transistors of multipath feedforward band pass amplifier 100, such that each amplification stage exhibits a relatively constant transconductance. In various implementations, a drain to source voltage ($V_{ds}$) of amplification transistors are regulated in servo loops to ensure relatively constant transconductance.

Figure 8:
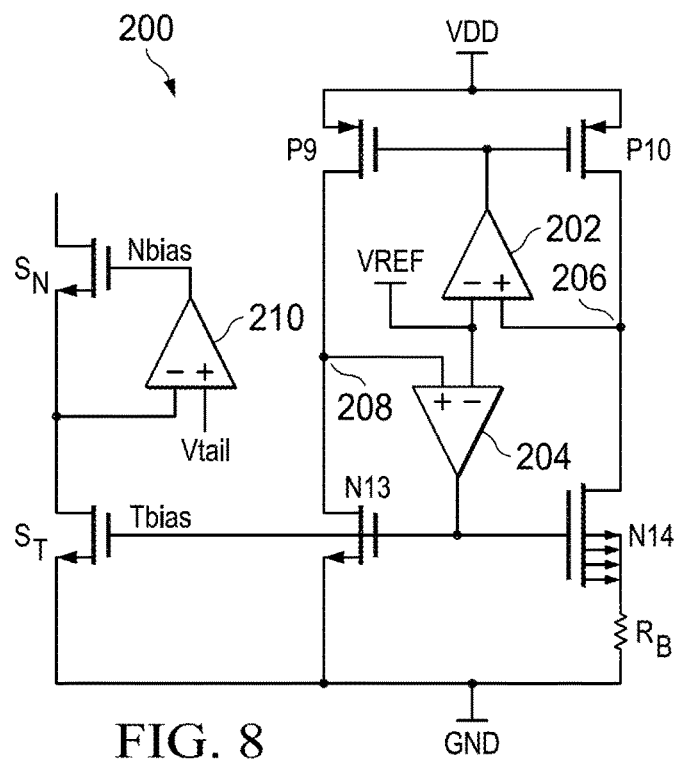
FIG. 8 is a schematic circuit diagram of an exemplary biasing servo loop that can be implemented for an amplification stage in a multipath feedforward amplifier to provide relatively constant transconductance biasing, according to various aspects of the present disclosure.

FIG. 8 is a schematic circuit diagram of an exemplary biasing servo loop 200 that can be implemented for an amplification stage to achieve relatively constant transconductance biasing according to various aspects of the present disclosure. Biasing servo loop 200 can bias amplification transistors of an amplification stage, for example, by setting a bias voltage ($T_{bias}$) applied to a current-source transistor $S_T$ or a bias voltage ($N_{bias}$) applied to a DC biasing bias, transistor $S_N$. Note that current-source transistor $S_T$ represents any transistor in the transistor-level amplification topologies described herein that receive bias voltage $T_{bias}$ and DC biasing transistor $S_N$ represents any transistor in the transistor-level amplification topologies described herein that receive bias voltage $N_{bias}$. In FIG. 8, biasing servo loop 200 includes an amplifier 202 and an amplifier 204 having negative input terminals (−) connected to a reference voltage, such as VREF (which, in some implementations, may be equivalent to voltage $V_{tail}$ depending on device characteristics), and positive input terminals (+) respectively connected to a node 206 and a node 208. Biasing servo loop 200 further includes a biasing resistor $R_B$, a pair of NMOS transistors (an NMOS transistor N13 and an NMOS transistor N14), and a pair of PMOS transistors (a PMOS transistor P9 and a PMOS transistor P10). In various implementations, the pair of NMOS transistors are different sizes, and the pair of PMOS transistors are a same size. For example, NMOS transistor N14 has a larger size than NMOS transistor N13, and PMOS transistor P9 has a same size as PMOS transistor P10. In such implementations, other than a size difference, NMOS transistor N13 and NMOS transistor N14 are configured to match the bias voltage ($T_{bias}$) applied to current-source transistor $S_T$. NMOS transistor N13 and NMOS transistor N14 have gates connected to an output of amplifier 204, and drains respectively connected to node 208 and node 206. NMOS transistor N13 has a source connected to a reference voltage, such as ground (GND), and NMOS transistor N14 has a source connected to the reference voltage through biasing resistor $R_B$, a value of which primarily determines a transconductance to be obtained. A resistance of biasing resistor $R_B$ can be designed to have a relatively constant temperature coefficient. In various implementations, biasing resistor $R_B$ can be tuned to overcome process variations. It is noted that biasing resistor $R_B$, in some implementations, represents an array of resistors and/or a resistor with a switching network for tuning a resistance of the resistor. Similarly, PMOS transistor P9 and PMOS transistor P10 have gates connected to an output of amplifier 202, drains respectively connected to node 208 and node 206, and sources connected to a reference voltage, such as a power supply (VDD). In some implementations, an amplifier 210 can have an output connected to a gate of DC biasing transistor $S_N$, a negative input terminal (−) connected to a drain of current-source transistor $S_T$, and a positive input terminal (+) connected to a voltage ($V_{tail}$). As configured, amplifier 202 and amplifier 204 can achieve a voltage at node 206 that is substantially equal to a voltage at node 208, and substantially equal to a reference voltage level, which may or may not be the same as voltage $V_{tail}$ depending on device characteristics. Tying amplifier 202 and amplifier 204 to a fixed voltage can prevent a current from changing too much between transistors, forcing the current to follow a current associated with biasing resistor $R_B$ (for example, in some implementations, $1/G_m$). In various implementations, each transconductance stage of band pass resonator 150 has an associated biasing servo loop. In various implementations, each amplification stage of multipath feedforward band pass amplifier 100 has an associated biasing servo loop. FIG. 8 has been simplified for the sake of clarity to better understand the inventive concepts of the present disclosure. Additional features can be added in biasing servo loop 200, and some of the features described below can be replaced or eliminated in other embodiments of biasing servo loop 200.

Figure 9:
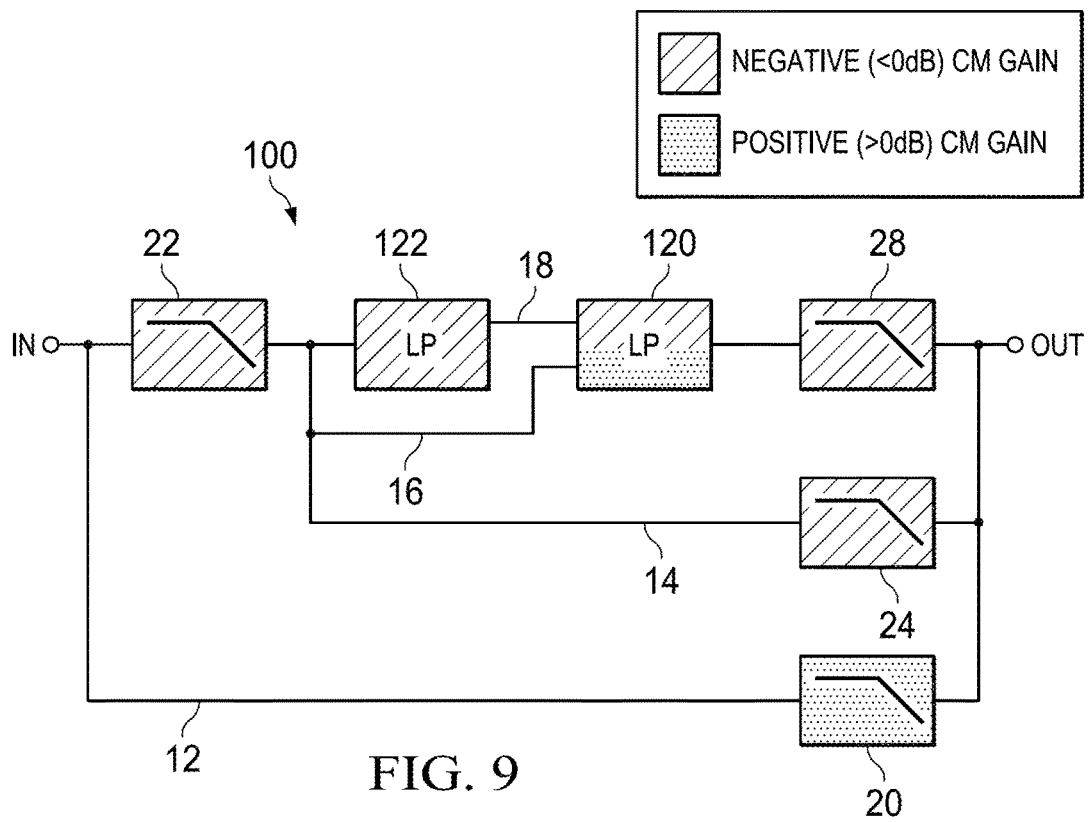
FIG. 9 is a block diagram of an exemplary multipath feedforward band pass amplifier viewed from a common mode gain perspective according to various aspects of the present disclosure.

When implementing a band pass resonator in amplification stages of the multipath feedforward band pass amplifier, common mode control and common mode stability become important, particularly arising from the positive feedback nature of the band pass resonator. Common mode stability strongly affects which transistor-level amplification topology is chosen for each amplification stage, along with any amplification stage sharing implemented by the multipath feedforward band pass amplifier. For example, in various implementations, each amplification stage may be limited to amplification transistor topologies that exhibit common mode suppression, either achieving a common mode gain below 0 dB or above 0 dB, yet stable. FIG. 9 is a block diagram of exemplary multipath feedforward band pass amplifier 100 viewed from a common mode gain perspective according to various aspects of the present disclosure. In FIG. 9, negative common mode gain less than about 0 dB is represented by closely spaced line shading, and positive common mode gain greater than about 0 dB is represented by dotted shading. In various implementations, a first-order amplification path of multipath feedforward band pass amplifier 100 is designed to exhibit a positive common mode gain, such that the first-order amplification path dominates an overall common mode gain of multipath feedforward band pass amplifier 100 to achieve stability. It is noted that, because of amplification stage sharing, overall negative common mode gain is difficult to achieve. Each amplification stage is implemented using one of the transistor-level amplification topologies depicted in FIGS. 5A-5D, such that multipath feedforward band pass amplifier 100 exhibits an overall multipath common mode gain greater than 0 dB with stable phase. For example, low pass amplifier 20 is configured with an transistor-level amplification topology that achieves a positive common mode gain, which dominates the overall common mode gain with its first order stable character; low pass amplifier 22, low pass amplifier 24, and low pass amplifier 28 are configured with amplification transistor topologies that achieve a negative common mode gain; band pass resonator 120 is configured with an transistor-level amplification topology that achieves a negative common mode gain and a positive common mode gain, corresponding to different pairs of input transistors; and band pass resonator 122 is configured with an transistor-level amplification topology that achieves a negative common mode gain. Though multipath feedforward band pass amplifier 100 exhibits an overall positive multipath common mode gain, the present disclosure contemplates various configurations of multipath feedforward band pass amplifier 100 that can exhibit an overall negative multipath common mode gain. FIG. 9 has been simplified for the sake of clarity to better understand the inventive concepts of the present disclosure. Additional features can be added in multipath feedforward band pass amplifier 100, and some of the features described below can be replaced or eliminated in other embodiments of multipath feedforward band pass amplifier 100.

In various implementations, multipath feedforward amplifiers (for example, multipath feedforward low pass amplifier 10 and multipath feedforward band pass amplifier 100) and systems for implementing the multipath feedforward amplifiers, and/or the various circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself. In various implementations, multipath feedforward amplifiers and systems for implementing the multipath feedforward amplifiers, and/or the various circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole.

An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind) Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense.

Further the various circuitry configurations described above can be replaced, substituted, or otherwise modified to accommodate various design implementations that achieve the lock detection mechanisms described herein. Moreover, using complementary electronic devices, hardware, software, etc. can offer an equally viable option for implementing the teachings of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 1110 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for amplifying a signal as described herein. The 'means for' can also or alternatively include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein. In various implementations, the various functions outlined herein may be implemented by logic encoded in one or more non-transitory and/or tangible media (for example, embedded logic provided in an application specific integrated circuit (ASIC), as digital signal processor (DSP) instructions, software (potentially inclusive of object code and source code) to be executed by a processor, or other similar machine, etc.).

What is claimed is:

1. A multipath feedforward band pass amplifier comprising:
   a plurality of amplification stages configured to form at least partially distinct amplification paths extending in parallel from an input terminal to an output terminal, each amplification path defined by a respective subset of the plurality of amplification stages and contributing to a different frequency response, wherein at least two of the amplification paths feedforwards past another amplification path at selected frequencies, at least one amplification stage is configured as a band pass resonator and at least one amplification stage is configured as a low pass amplifier; and
   further wherein the multipath feedforward band pass amplifier combines the different frequency responses of the amplification paths to optimize gain of the multipath feedforward band pass amplifier over a frequency range, and at least one amplification path cascades at least two amplification stages configured as band pass resonators to maximize gain at a frequency of interest within the frequency range.

2. The multipath feedforward band pass amplifier of claim 1, wherein the band pass resonators are active Gm-C circuits.

3. The multipath feedforward band pass amplifier of claim 1, wherein an input transconductor stage of each band pass resonator is configured to exhibit a negative transconductance.

4. The multipath feedforward band pass amplifier of claim 1, wherein each amplification stage includes an amplification transistor topology selected from a group consisting of a differential pair of transistors, a pseudo differential pair of transistors, a complementary differential pair of transistors, and a complementary pseudo differential pair of transistors.

5. The multipath feedforward band pass amplifier of claim 1, further including, for each amplification stage, a biasing servo loop for providing constant transconductance biasing.

6. The multipath feedforward band pass amplifier of claim 5, wherein the biasing servo loop includes a first amplifier and a second amplifier configured to regulate a drain to source voltage of biasing transistors of the amplification stage.

7. The multipath feedforward band pass amplifier of claim 6, wherein the biasing servo loop is configured to bias a current-source transistor bias at a DC bias point.

8. The multipath feedforward band pass amplifier of claim 1, wherein a first-order amplification path is configured to achieve a positive common mode gain that dominates an overall common mode gain of the multipath feedforward band pass amplifier.

9. The multipath feedforward band pass amplifier of claim 1, wherein an input of each amplification stage is AC coupled.

10. The multipath feedforward band pass amplifier of claim 1, wherein at least one amplification path is defined by a first amplification stage, at least one middle amplification stage, and a last amplification stage connected in series, wherein the at least one middle amplification stage is a band pass resonator, and further wherein the first amplification stage and the last amplification stage are low pass amplifiers.

11. The multipath feedforward band pass amplifier of claim 10, wherein the low pass amplifiers are first-order transconductance amplifiers.

12. The multipath feedforward band pass amplifier of claim 1, further including a compensation capacitor connected to an input and an output of the last amplification stage.

13. A multipath feedforward band pass amplifier for high frequency applications, the multipath feedforward band pass amplifier comprising:
- a plurality of amplification paths extending in parallel from an input terminal and an output terminal, each amplification path having a number of amplification stages equal to a degree of an order of the amplification path, each amplification path having a crossover frequency and a gain, wherein the amplification stages include low pass amplification stages and band pass amplification stages, and wherein at least one amplification stage is shared among the plurality of amplification paths; and
- further wherein the gains and crossover frequencies associated with the amplification paths are stacked with crossover frequency scaling to optimize crossover frequency of the multipath feedforward bandpass amplifier and gain of the multipath feedforward bandpass amplifier at a frequency of interest, and the low pass amplification stages and the band pass amplification stages of the plurality of amplification paths are configured to optimize gain at a center frequency ranging from about 2 GHz to about 3 GHz.

14. The multipath feedforward band pass amplifier of claim 13, wherein the band pass amplification stages are active Gm-C resonators.

15. The multipath feedforward band pass amplifier of claim 13, wherein input transconductor stages of the band pass amplification stages are configured to exhibit a negative transconductance.

16. The multipath feedforward band pass amplifier of claim 13, wherein each amplification stage includes an AC coupled input, and the multipath feedforward band pass amplifier further includes, for each amplification stage, a biasing servo loop configured to provide constant transconductance biasing to the amplification stage.

17. The multipath feedforward band pass amplifier of claim 13, wherein a first-order amplification path is configured to achieve a positive common mode gain that dominates an overall common mode gain of the multipath feedforward band pass amplifier.

18. A multipath feedforward band pass amplifier comprising:
- a first-order amplification path, a second-order amplification path, a third-order amplification path, and a fourth-order amplification path extending in parallel from an input terminal and an output terminal, each amplification path having a number of amplification stages equal to a degree of an order of the amplification path, wherein:
  - any middle amplification stage of the amplification paths is a band pass resonator;
  - the second-order amplification path, the third-order amplification path, and the fourth-order amplification path share a first-in order amplification stage; and
  - the third-order amplification path and the fourth-order amplification path share a middle amplification stage and a last-in order amplification stage.

19. The multipath feedforward band pass amplifier of claim 18, wherein the first-in order and last-in order amplification stages of each amplification path are low pass amplifiers.

20. The multipath feedforward band pass amplifier of claim 18, wherein the first-order amplification path exhibit a positive common mode gain.

* * * * *